(12) United States Patent
Babcock et al.

(10) Patent No.: US 11,768,222 B2
(45) Date of Patent: Sep. 26, 2023

(54) PORTABLE CONNECTOR ASSEMBLY

(71) Applicant: Test Products, Incorporated, Sterling Heights, MI (US)

(72) Inventors: Carlton R. Babcock, West Bloomfield, MI (US); Thomas A. Gillespie, Macomb, MI (US); John P. Bergmann, Washington, MI (US); John D. Bruszewski, Royal Oak, MI (US)

(73) Assignee: Test Products, Incorporated, Sterling Heights, MI (US)

( * ) Notice: Subject to any disclaimer, the term of this patent is extended or adjusted under 35 U.S.C. 154(b) by 169 days.

(21) Appl. No.: 17/222,146

(22) Filed: Apr. 5, 2021

(65) Prior Publication Data

US 2021/0311093 A1    Oct. 7, 2021

Related U.S. Application Data

(60) Provisional application No. 63/005,194, filed on Apr. 3, 2020.

(51) Int. Cl.
*G01R 1/04* (2006.01)
*H01R 13/631* (2006.01)
*H01R 13/639* (2006.01)
*H01R 13/73* (2006.01)

(52) U.S. Cl.
CPC ......... *G01R 1/0416* (2013.01); *H01R 13/631* (2013.01); *H01R 13/639* (2013.01); *H01R 13/73* (2013.01); *H01R 2201/20* (2013.01)

(58) Field of Classification Search
CPC ........ G16H 40/67; G08C 19/00; G08C 17/00; G08C 2201/93
See application file for complete search history.

(56) References Cited

U.S. PATENT DOCUMENTS

| | | | | |
|---|---|---|---|---|
| 5,931,791 A * | 8/1999 | Saltzstein | ............... | A61B 5/742 600/513 |
| 6,137,675 A * | 10/2000 | Perkins | ................... | G06F 1/163 361/679.08 |
| 6,962,277 B2 | 11/2005 | Quintana | | |
| 7,218,117 B2 | 5/2007 | Roberts | | |
| 9,768,538 B1 | 9/2017 | Tulloch | | |
| 2002/0074370 A1* | 6/2002 | Quintana | ................ | A45F 5/021 224/660 |
| 2004/0127802 A1* | 7/2004 | Istvan | .................... | A61B 5/282 600/509 |
| 2005/0165323 A1* | 7/2005 | Montgomery | ......... | A61B 5/369 128/903 |
| 2009/0153128 A1 | 6/2009 | Yu | | |

(Continued)

OTHER PUBLICATIONS

ISR for PCT/US2021/025735 dated Jul. 14, 2021.
Written Opinion of ISA for PCT/US2021/025735 dated Jul. 14, 2021.

*Primary Examiner* — Jermele M Hollington
*Assistant Examiner* — Temilade S Rhodes-Vivour
(74) *Attorney, Agent, or Firm* — Simonelli IP, PLLC

(57) ABSTRACT

A portable connector assembly includes a belt having a clasp for creating a closed loop with the belt. A receiver has port and control electronics. A battery is removably securable in the port of the receiver. The assembly also includes an industrial connector electrically connected to the receiver for electrically connecting the control electronics with a product connector.

10 Claims, 6 Drawing Sheets

(56) References Cited

U.S. PATENT DOCUMENTS

2016/0078752 A1* 3/2016 Vardi ............... H04B 1/385
                                                340/506
2017/0116725 A1 4/2017 Stuart

* cited by examiner

PORTABLE CONNECTOR ASSEMBLY

This patent application claims priority to US provisional patent application having application Ser. No. 63/005,194 and filed on Apr. 3, 2020, the disclosure in which is expressly incorporated herein by reference.

BACKGROUND OF THE INVENTION

1 Field of the Invention

The invention relates to a portable connector assembly. More particularly, the invention relates to a portable connector assembly having a connector that reduces damage to devices to which it is being connected.

2. Description of the Related Art

Testing equipment can be large and cumbersome. In certain environments, testing equipment requires fixtures that allow the testing equipment to be mounted to walls and/or ceilings. This is expensive and limits the mobility and flexibility in operations due to the sheer size of this equipment.

SUMMARY OF THE INVENTION

A portable connector assembly tests a product having a product connector. The portable connector assembly includes a receiver adapted to be worn by a user. The receiver houses control electronics. The receiver also includes a battery port. A battery is removably securable in the battery port of the receiver. The battery supplies power to the control electronics. An industrial connector is electrically connected to the control electronics to electrically connect the control electronics to the product connector, such that the control electronics can test the product and or the product connector.

BRIEF DESCRIPTION OF THE DRAWINGS

Advantages of the invention will be readily appreciated as the same becomes better understood by reference to the following detailed description when considered in connection with the accompanying drawings, wherein.

DETAILED DESCRIPTION OF THE INVENTION

Figure 1:
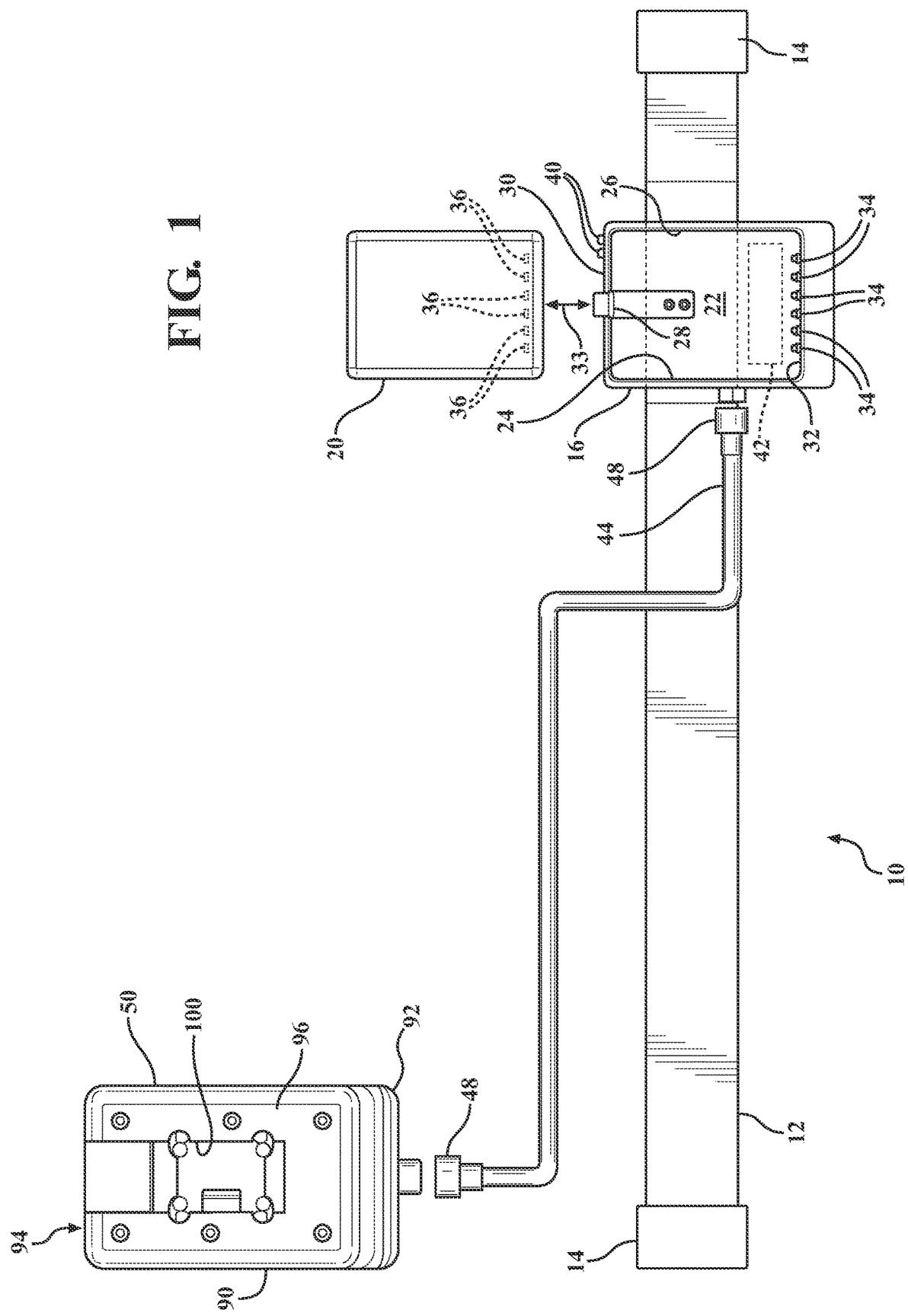
FIG. 1 is a partially exploded side view of one embodiment of an assembly.

Referring to FIG. 1, one embodiment of the portable connector assembly is generally indicated at 10. This embodiment of the portable connector assembly 10 includes a belt 12 having a clasp 14. The belt 12 is of industrial quality and is capable of having equipment secured thereto. It should be appreciated by those skilled in the art that the portable connector assembly 10 could be secured to another article of clothing instead of the belt 12. Other types of clothing include, but are not limited to, vests, coats, arm bands, pants, helmets, and the like. And the portable connector assembly 10 can be removably securable to the article of clothing instead of being fixedly secured thereto. Clasps, holsters, snaps, and buttons are a non-exhaustive list of the types of devices that could temporarily secure the portable connector assembly 10 to an article of clothing.

A receiver 16 is removably secured to the belt 12. The receiver 16 receives a battery pack 20 into a battery port 22 of the receiver 16. In the embodiment shown, the battery port 22 has three sides 24, 26, 30 and a port floor 32. It should be appreciated by those skilled in the art that the receiver 16 could have a fourth side. The battery pack 20 slides into and out of the port 20 in directions indicated by a double arrow 33, and is latched in place a battery latch 28. The port floor 32 includes a plurality of leads 34 extending out therefrom. The leads 34 are conductive. In one embodiment the leads 34 are spring-loaded such that the retract when there is positive contact between the leads 34 and conductive pads 36 of the battery pack 20. Power, data and/or instructions/commands are communicated between the receiver 16 and the battery pack 20 through the contact provided by the leads 34 and the conductive pads 36. Light indicators 40 indicate when the battery pack 20 is operating and when the battery pack 20 is low and needs to be replaced and/or recharged.

The receiver 16 includes intelligent circuitry (not shown) that can perform various functions as a relates to the battery pack 20. These functions include, but are not limited to, connection cycle counts, maintenance needs, tracking information, and the like.

The receiver 16 also includes at least one electrical component 42 (shown in phantom). The electrical component 42 may be any type of control electronics or sensing equipment needed for a particular task for the user that is wearing the portable connector assembly 10. In one embodiment, the electrical component 42 is test equipment. In another embodiment, the electrical component 42 may be used to control a ventilator fan.

When the electrical component 42 is designed to test equipment, an industrial connector 50 is connected thereto through a wire harness 44 that is removably securable through a connector 48 at either end of the wire harness 44. If the electrical component 42 is not a piece of test equipment, the electrical component 42 may be a control for a particular piece of electronic equipment.

Figure 2A:
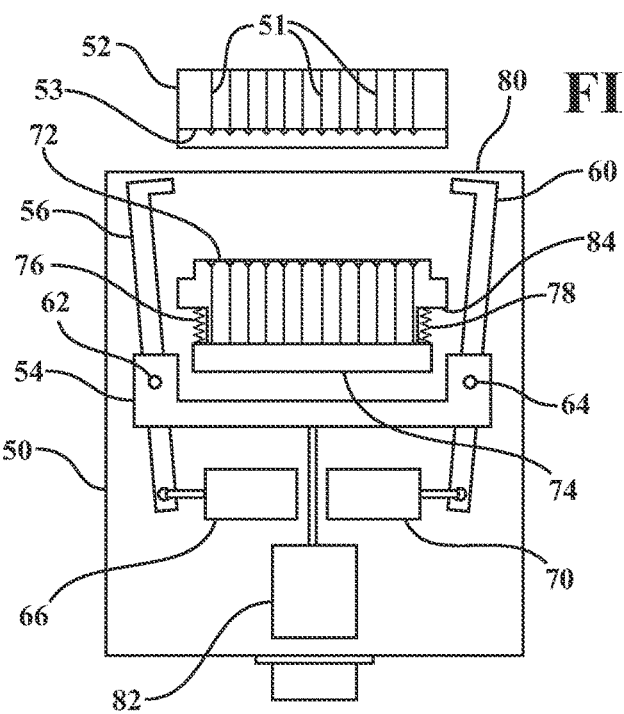
FIGS. 2A through 2C are side schematic views of three steps of a product being inserted into a connector used in the embodiment shown in FIG. 1.
Figure 2B:
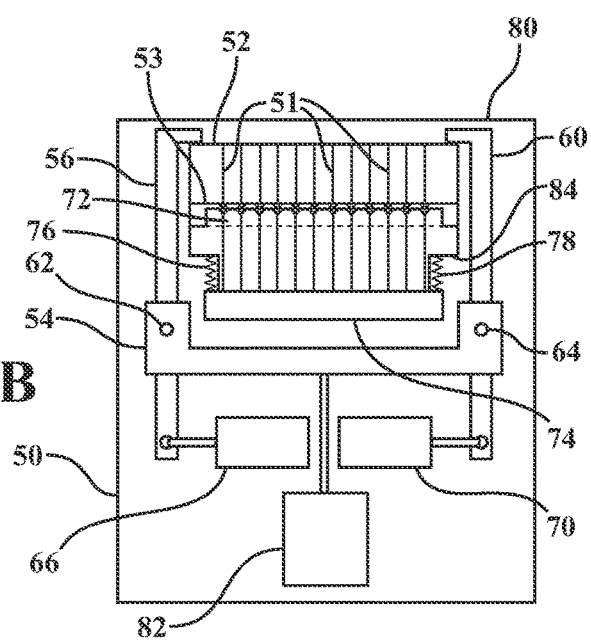
Figure 2C:
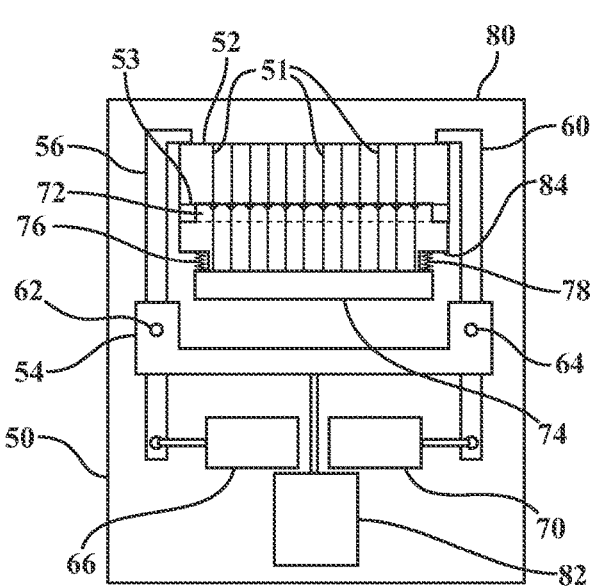

Referring to FIGS. 2A through 2C, the industrial connector 50 is schematically shown in various stages of use. In FIG. 2A, the connector 50 is about to receive a product connector 52 therein. The product connector 52 is connected to a product to be powered, tested and/or controlled by the portable connector assembly 10. The product connector 52 has a plurality of connector probes 51 and a probe protection platform 53. During testing, the spatial relationship between the plurality of connector probes 51 and the probe protection platform 53 cannot change.

The industrial connector 50 includes a frame 54, which has two latches 56, 60 pivotally secured thereto with pivot pins 62, 64. Each of the latches 56, 60 are side latches and are moved by a servo motor 66, 70. The industrial connector 50 also includes a plurality of industrial probes 72 that are fixed to the contact base 74.

Springs 76, 78 are also fixedly secured to the contact base 74. The springs 76, 78 are compression springs designed to extend toward an open end 80 of the industrial connector 50.

Referring to FIG. 2B, the product connector 52 is shown inserted into the industrial connector 50. Once the industrial connector 50 senses the product connector 52 being inserted sufficiently into the industrial connector 50, the servo motors 66, 70 move the side latches 56, 60 to latch the product connector 52 therein. This prevents the product connector 52 from being released during operation. It should be noted that at this point in the connection process, the plurality of industrial probes 72 have yet to contact the plurality of connector probes 51.

Referring to FIG. 2C, a third servo motor 82 has pulled the frame 54 into a retracted position further within the industrial connector 50. The third servo motor 82 operates in a linear direction perpendicular to the first 66 and second 70 servo motors. In addition, the third servo motor 82 creates a larger force and has a larger stroke than the first 66 and second 70 servo motors. In the embodiment shown, the third servo motor 82 is mounted to the industrial connector 50 in an orientation perpendicular to the direction the first 66 and second 70 servo motors are mounted to the industrial connector 50.

When the third servo motor 82 pulls the frame 54 away from the open end 80 of the industrial connector 50, it forces the latches 56, 60 to pull the product connector 52 further into the industrial connector 50. A probe protector 84 is forced to move by the movement of the product connector 52, which compresses the springs 76, 78. Movement of the probe protector 84 with the product connector 52 provides a uniform, physical connection between the plurality of connector probes 51 and the plurality of industrial probes 72 in a manner that ensures the proper electrical connection between the product connector 52 in the plurality of industrial probes 72 in a manner which does not damage either 52, 72 or create any unwanted wire breaks and/or continuity breaks due to the wire harness 48 pulling on the product connector 52. When the third servo motor 82 moves the frame 54 back toward the open end 80 of the industrial connector 50, the probe protector 84 moves back into its protective position due to the springs 76, 78 providing a uniform disengagement of the plurality of connector probes 51 from the plurality of industrial probes 72.

Figure 3:
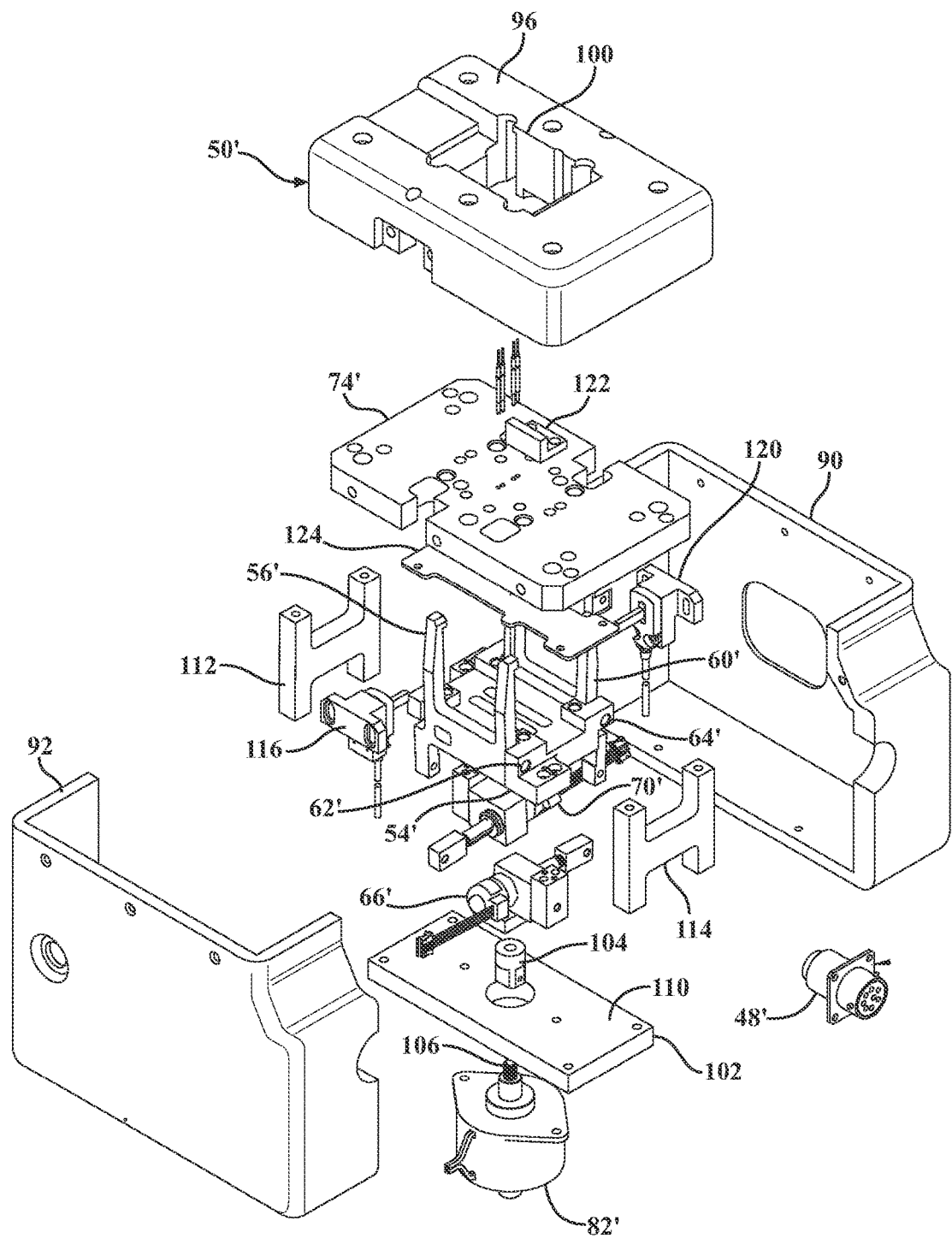
FIG. 3 is an exploded perspective view of a second embodiment of an industrial connector.
Figure 4:
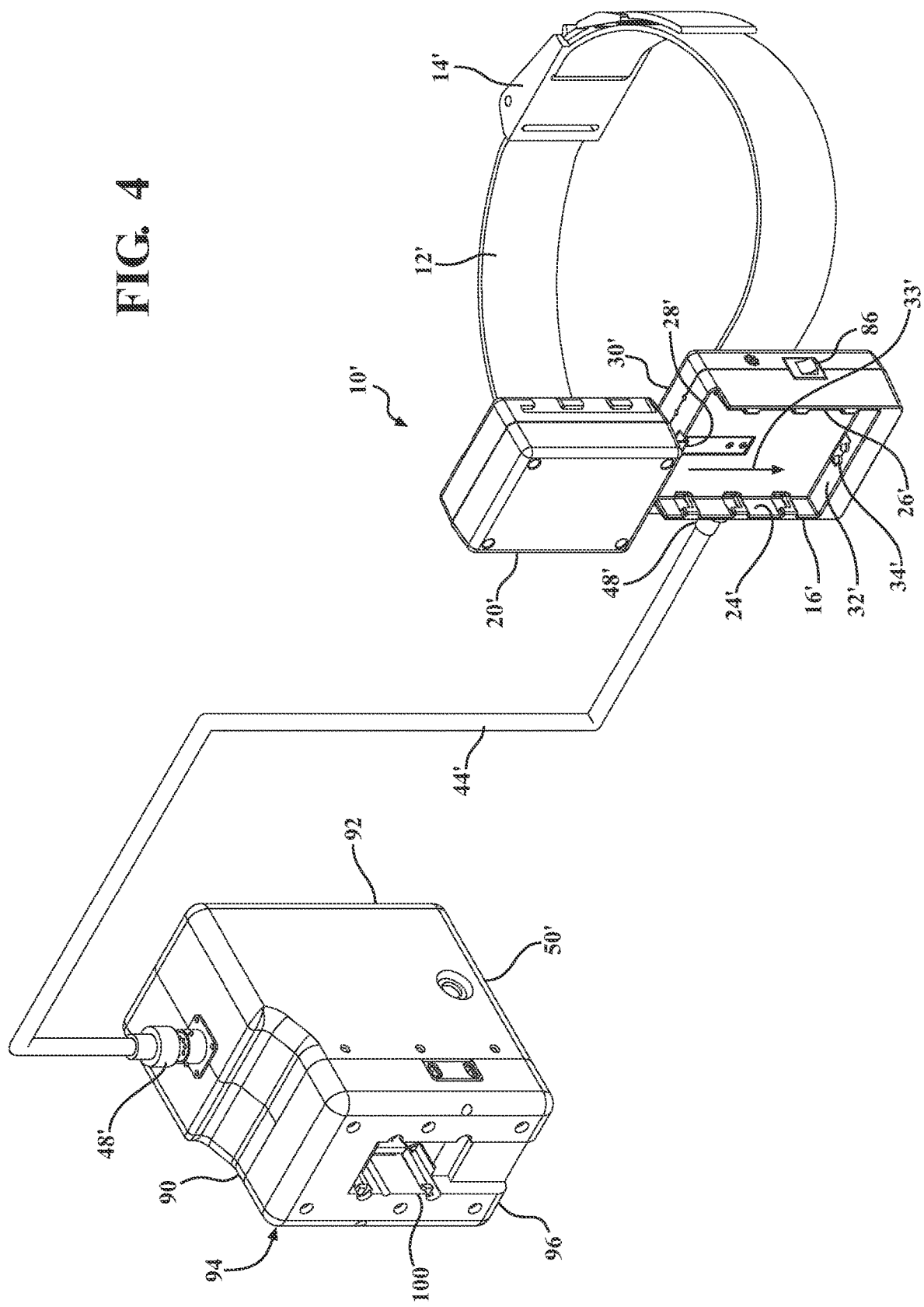
FIG. 4 is a perspective view of the second embodiment.
Figure 5:
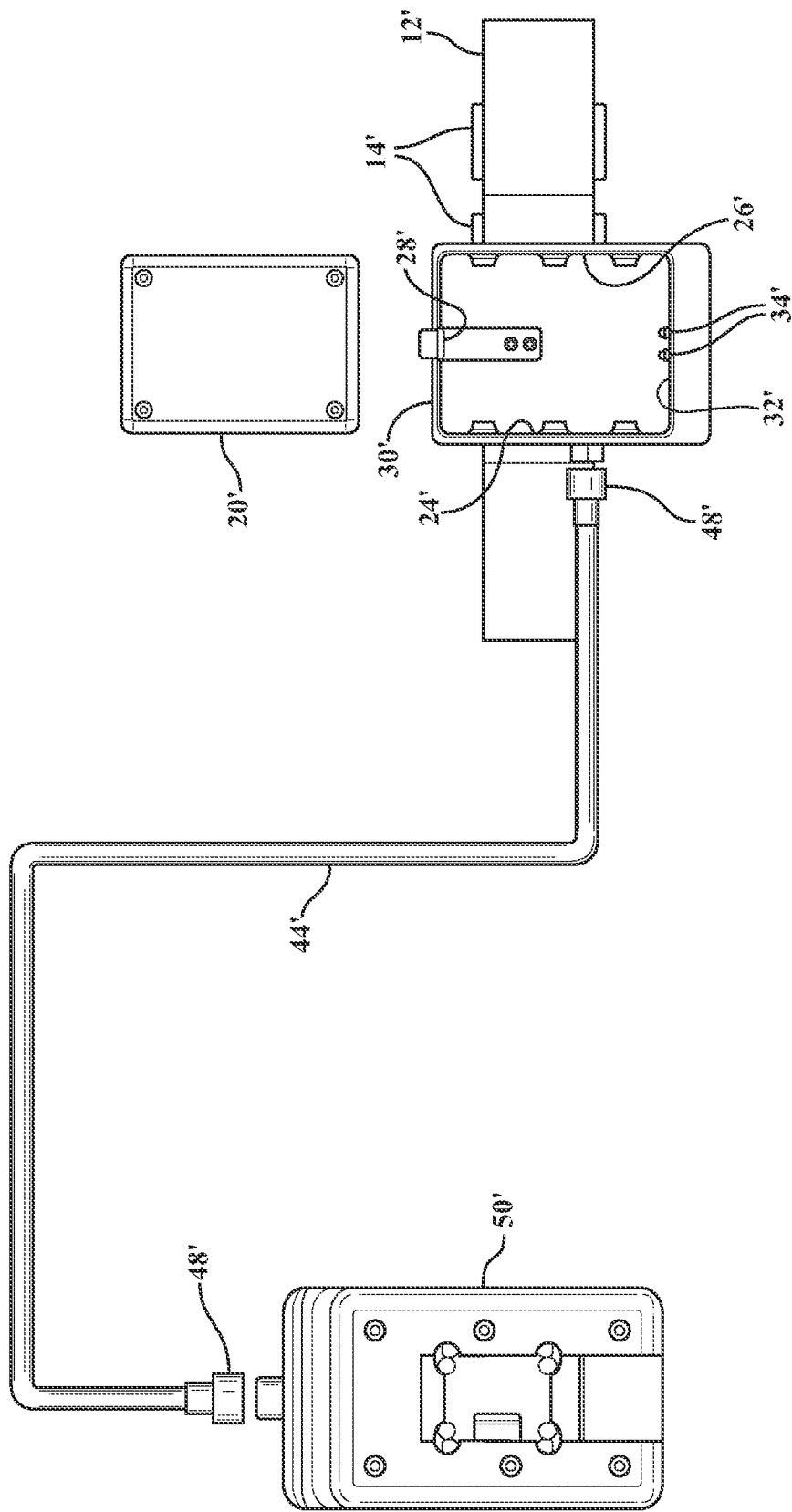
FIG. 5 is a side view of the second embodiment with a battery shown removed from a battery port.

Referring to FIGS. 3 through 5, an alternative embodiment is shown wherein primed reference numerals similar to those in the first embodiment indicate elements that are similar between the two embodiments.

Referring to FIGS. 4 and 5, the embodiments look substantially similar to the first embodiment. One of the only differences shown on the exterior is a power switch 86 on a side 26' of the receiver 16'.

Referring to FIG. 3, the second embodiment of the industrial connector 50' is shown. The industrial connector 50' includes first 90 and second 92 housing halves to form the connector housing 94. The two halves 90, 92 are secured together through standard means. The connector housing 94 also includes a receptacle plate 96. The receptacle plate 96 defines a receptacle 100 to receive the product connector 52 (not shown in this Figure) therein.

Diametrically opposed the receptacle plate 96 is an actuator support plate 102. A draw down actuator 82' is mounted to the actuator support plate 102. The draw down actuator 82' provides the same function in this embodiment as the third servo motor 82 provides in the first embodiment. The draw down actuator 82' can be a servo motor, a stepper motor and the like.

Two latch actuators 66', 70' are mounted to the actuator support plate 102 on a side 110 of the actuator support plate 102 opposite the side (not shown) to which the draw down actuator 82' is secured. As with the draw down actuator 82', the latch actuators 66', 70' may be a servo motor, a stepper motor and the like.

The latch actuators 66', 70' are parallel to each other and perpendicular to the draw down actuator 82'. A spacer 104 extends over a shaft 106 of the draw down actuator 82', wherein the shaft 106 extends through the actuator support plate 102.

Two actuator spacers 112, 114 extend up from the actuator support plate 102 to maintain the spacing between the actuator support plate 102 and the receptacle plate 96. In addition, there are two part present sensors 116, 120 disposed on either side of the contact base (or fixture plate) 74'. The part present sensors 116, 120 identify when the product connector 52 is inserted into the industrial connector 50'. The part present sensors 116, 120 may be any type of sensor that can identify the presence of an object. In the embodiment shown in FIG. 3, the sensors 116, 120 are optical sensors. A guide block 122 assists in aligning the product connector 52 as it is inserted into the industrial connector 50'.

A circuit board 124 is disposed adjacent the contact base 74'. The circuit board 124 routes electrical conductors around the two latches 56', 60' so as to not be affected by the movement of the two latches 56', 60', or the draw down actuator 82'.

Figure 6:
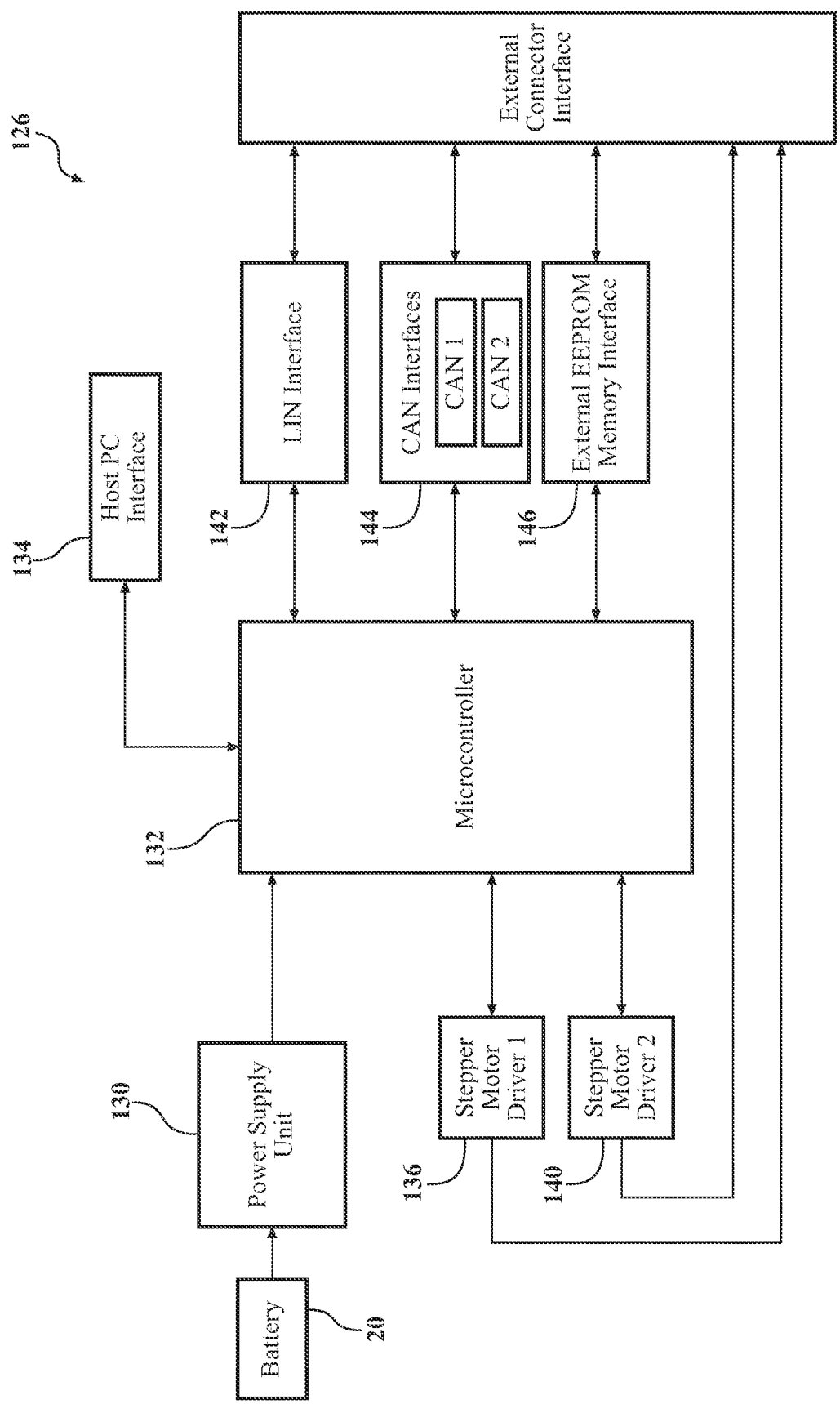
FIG. 6 is a block diagram of electronics used to control the assembly.

Referring to FIG. 6, a block diagram of a control circuit board is generally indicated at 126. The circuit receives power from the battery pack 20 through a power supply unit 130. The electrical power powers a microcontroller 132, which in turn, feeds electrical power to the rest of the control circuit board 126. In one embodiment, the microcontroller 132 is an NXP Semiconductors microcontroller having part number LPC1788FBD144, and includes a communications port 134, allowing it to communicate with a host computer (not shown) to upload instructions and download data retrieved.

The microcontroller 132 provides power and instructions to two stepper motor drivers 136, 140. The first stepper motor driver 136 drives the two side latches 56', 60' and the second stepper motor driver 140 drives the draw down actuator 82'.

The microcontroller 132 also communicates to a UN interface 142, CAN interfaces 144 and an external EEPROM memory interface 146 through parallel connections. An external connector interface 150 communicates with all devices 136, 140, 142, 144, 146 connected to the microcontroller 132 to facilitate the transfer of data and/or instructions to the appropriate elements of the portable connector assembly 10, 10'.

In operation, the user installs the battery 20 into the receiver 16. The power switch 86 is then turned on. The receiver 16 has a power on, and low battery indicators 40. The user connects the portable connector assembly 10 to the product connector 52 being functioned or tested.

The portable connector assembly 10 detects that the industrial connector 50, 50' is connected and increments the connector cycle count and stores it in memory in the portable connector assembly 10.

The portable connector assembly 10 drives the first stepper motor 66, 66' using the stepper motor driver 136 to move the two side latches 56, 56', 60, 60' to latch the product connector 52 being functioned or tested into the receptacle plate 96 of the connector housing 94. The portable connector assembly 10 then drives the draw down actuator 82, 82' using the stepper motor driver 140 to lower the product connector 52 of the product being functioned or tested onto the contact base 74, 74' inside the industrial connector 50, 50'. The portable connector assembly 10 can then automatically perform the desired functions based on the application needs. If any operator interaction is needed, buttons, switches, and/or indicator lights on the portable connection assembly 10 will facilitate this interaction between the user and the control electronics 124.

After the application is complete, the draw down actuator 82, 82' is reversed to raise the product connector 52 up off of the electrical contacts 74, 74'. The latch stepper motors 66, 66', 70, 70' are reversed to then release the product connector 52 and the product. The control electronics 124 in the connector housing 94 will include circuitry discussed above to communicate with a host PC to share data, based on the application needs.

These embodiments have been described in an illustrative manner. It is to be understood that the terminology, which has been used, is intended to be in the nature of words of description rather than of limitation.

Many modifications and variations of the embodiments are possible in light of the above teachings. Therefore, within the scope of the appended claims, the subject discussed herein may be practiced other than as specifically described.

We claim:

1. A portable connector assembly for testing a product having a product connector, said portable connector assembly comprising:
    a receiver adapted to be worn by a user, said receiver housing control electronics, and having a battery port;
    a battery removably securable in said battery port of said receiver, said battery supplying power to said control electronics; and
    an industrial connector electrically connected to said control electronics for electrically connecting said control electronics to the product connector such that said control electronics can test the product, said industrial connector including a latch to selectively secure the product connector to said industrial connector and a latch actuator to selectively activate said latch when the product connector is inserted into said industrial connector.

2. A portable connector assembly as set forth in claim 1 wherein said industrial connector includes a retraction servo motor to retract the product connector into said industrial connector after said latch secures the product connector.

3. A portable connector assembly as set forth in claim 2 wherein said industrial connector includes a fixture plate to electrically contact the product connector when the product connector is latched by said latch.

4. A portable connector assembly as set forth in claim 3 including a circuit board disposed adjacent said fixture plate, said circuit board designed to route electrical circuits around and away from said retractor.

5. A portable connector assembly as set forth in claim 1 wherein said receiver is securable to an article of clothing.

6. A portable connector assembly as set forth in claim 5 wherein said article of clothing is a belt.

7. A portable connector assembly as set forth in claim 1 wherein said latch actuator pivots first and second latch arms in opposing complementary directions to selectively secure the product connector to said industrial connector, and in opposite complementary opposing directions to selectively release the product connector from said industrial connector.

8. A portable connector assembly as set forth in claim 7 wherein said latch actuator includes first and second latch servo motors, each connected to said first and second latch arms.

9. A portable connector assembly as set forth in claim 8 including first and second latch arms pivoted by said first and second latch actuators, respectively.

10. A portable connector assembly for testing a product having a product connector, said portable connector assembly comprising:
    a receiver adapted to be worn by a user, said receiver housing control electronics, and having a battery port;
    a battery removably securable in said battery port of said receiver, said battery supplying power to said control electronics; and
    an industrial connector electrically connected to said control electronics for electrically connecting said control electronics to the product connector such that said control electronics can test the product, said industrial connector including a retraction servo motor to retract the product connector into said industrial connector after said latch secures the product connector.

* * * * *